(12) United States Patent
Chiu

(10) Patent No.: US 11,482,991 B1
(45) Date of Patent: Oct. 25, 2022

(54) DELAY CIRCUIT AND CIRCUIT SYSTEM

(71) Applicant: NUVOTON TECHNOLOGY CORPORATION, Hsinchu (TW)

(72) Inventor: Ching-Yen Chiu, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/401,862

(22) Filed: Aug. 13, 2021

(30) Foreign Application Priority Data

Jun. 11, 2021 (TW) .................................. 110121555

(51) Int. Cl.
*H03K 5/13* (2014.01)
*H03K 5/00* (2006.01)

(52) U.S. Cl.
CPC ..... *H03K 5/13* (2013.01); *H03K 2005/00234* (2013.01)

(58) Field of Classification Search
CPC ........................ H03K 5/13; H03K 2005/00234
USPC ......................................................... 327/142
See application file for complete search history.

(56) References Cited

U.S. PATENT DOCUMENTS

| | | | | |
|---|---|---|---|---|
| 6,259,284 B1* | 7/2001 | Hwang | ................ | H03K 17/284 327/143 |
| 6,400,540 B1* | 6/2002 | Chang | ................ | H01L 27/0259 257/357 |
| 7,019,417 B2* | 3/2006 | Kang | ................... | H03K 17/223 307/130 |
| 7,081,779 B2* | 7/2006 | Kang | ................... | H03K 17/145 327/143 |
| 7,164,300 B2* | 1/2007 | Hsu | ....................... | H03K 17/302 327/143 |
| 8,514,532 B2* | 8/2013 | Worley | ................. | H02H 9/046 361/111 |
| 2005/0068702 A1* | 3/2005 | Connor | ............... | H01L 27/0285 361/56 |
| 2008/0106308 A1* | 5/2008 | Tu | ............................. | G06F 1/24 327/143 |

* cited by examiner

*Primary Examiner* — Ryan Jager
(74) *Attorney, Agent, or Firm* — Muncy, Geissler, Olds & Lowe, P.C.

(57) ABSTRACT

A delay circuit includes a voltage/current conversion unit, a capacitor, and an output logic unit. The voltage/current conversion unit receives an input signal and generates current based on a voltage level of the input signal, and the generated current is proportional to the voltage level of the input signal. The capacitor is electrically connected to the voltage/current conversion unit and configured to receive the current generated by the voltage/current conversion unit, to charge. The output logic unit is electrically connected to the capacitor configured to receive a voltage signal on a terminal of the capacitor and generate an output signal based on the voltage signal, a delay time between a transition time point of the input signal and a transition time point of the output signal is not related to the voltage level of the input signal.

16 Claims, 4 Drawing Sheets

DELAY CIRCUIT AND CIRCUIT SYSTEM

BACKGROUND OF THE INVENTION

1. Field of the Invention

The present invention is related to a delay circuit, and more particularly to a delay circuit having a delay time which is not affected by a change in a voltage, and the present invention is also related to a circuit system using the delay circuit.

2. Description of the Related Art

A delay circuit is used to delay timing of an output signal reaching a specific voltage in response to input signal. In a condition that a voltage level of the input signal is the same as that of a supply voltage, the delay circuit can be used as a power soft-start circuit, and the power soft-start circuit is often applied in automotive electronics, computers and various electronic products. The output signal of the power soft-start circuit takes a period of delay time to transit to the specific voltage, so the power soft-start circuit can protect the circuit, equipment or device connected to the power soft-start circuit from receiving the unstable voltage, thereby preventing the circuits, equipment or devices in back-end from being easily damaged to reduce service life. However, the conventional delay circuit may have different delay time in response to different voltage level of the input signal, so there is still room for improvement.

Please refer to FIG. 1, which is a circuit diagram of a conventional delay circuit. The delay circuit 1 includes a voltage source 11, a resistor R, and a capacitor C, the resistor R is electrically connected between the capacitor C and the voltage source 11. The voltage source 11 is configured to provide an input signal with the voltage level being a supply voltage $V_{DD}$, to charge the capacitor C, so as to form an output signal with specific voltage $V_C$ being voltage level on a terminal of the capacitor C. The delay time of the delay circuit 1 of FIG. 1 is a RC delay time, the relation between the specific voltage VC and the supply voltage VDD satisfies the following equation: $V_C=V_{DD}(1-e^{-t/RC})$, so that the time t for the output signal to reach the specific voltage $V_C$ satisfies the equation: $t=-RC\ln(1-V_C/V_{DD})$. Obviously, the delay time is related to the voltage level of the input signal (that is, the voltage level of the supply voltage $V_{DD}$). As a result, the delay time is varied in response to a change in the voltage level of input signal (that is, the voltage level of the supply voltage $V_{DD}$).

Please refer to FIG. 2, which is a circuit diagram of another conventional delay circuit. The delay circuit 2 includes a current source 21, a capacitor C, and a comparator 22. The current source 21 receives the input signal with a supply voltage $V_{DD}$ and is electrically connected to the capacitor C. A positive input terminal and a negative input terminal of the comparator 22 are electrically connected to the capacitor C and the reference voltage $V_{REF}$, respectively. The current source 21 provides constant current $I_C$ to charge the capacitor C. After the voltage on one terminal of the capacitor C is charged to the reference voltage $V_{REF}$, the voltage level of the output signal CMP_OUT of comparator 22 is changed to the supply voltage $V_{DD}$. By using the fixed current IC to charge the capacitor C and using the comparator 22, the delay time for transition of the output signal CMP_OUT to the supply voltage $V_{DD}$ after the delay circuit 2 is powered on can be fixed. However, the conventional circuit of FIG. 2 requires more circuit elements including a current bias circuit, a voltage bias circuit, a comparator, and a bias circuit for static current, and it causes technical problems of larger circuit area and higher power consumption.

SUMMARY OF THE INVENTION

An objective of the present invention is to provide a delay circuit to solve the above-mentioned conventional problems.

In order to achieve the objective of the present invention, an embodiment of the present invention provides a delay circuit including a voltage/current conversion unit, a capacitor and an output logic unit. The voltage/current conversion unit is configured to receive an input signal and generate current based on a voltage level of the input signal, wherein the generated current is proportional to the voltage level of the input signal. The capacitor is electrically connected to the voltage/current conversion unit and configured to receive the current, generated by the voltage/current conversion unit, to charge. The output logic unit is electrically connected to the capacitor and configured to receive a voltage signal on a terminal of the capacitor, to generate an output signal based on the voltage signal, wherein a delay time between a transition time point of the input signal and a transition time point of the output signal is not related to the voltage level of the input signal.

According to an embodiment of the delay circuit, when a voltage level of the voltage signal is equal to a half of the voltage level of the input signal, transition of the output signal occurs According to an embodiment of the delay circuit, he output logic unit includes at least one inverter.

According to an embodiment of the delay circuit, the output logic unit includes an even number of inverters connected in series.

According to an embodiment of the delay circuit, the input signal is a supply voltage, the output logic unit receives an operating voltage, and the operating voltage is related to the supply voltage.

According to an embodiment of the delay circuit, the voltage/current conversion unit includes a source degeneration resistor and a transistor. The transistor includes a gate electrically connected to a ground voltage, and a drain electrically connected to a capacitor. The source degeneration resistor is electrically connected between the source of the transistor and the input signal.

According to an embodiment of the delay circuit, the transistor can be a PMOS transistor.

According to an embodiment of the delay circuit, a resistance value of the source degeneration resistor is far greater than a reciprocal of a transduction of the transistor in a small-signal model.

According to an embodiment of the delay circuit, the voltage/current conversion unit includes a resistor disposed between the source degeneration resistor and the input signal, and a resistance value of the resistor is far greater than a reciprocal of a transduction of the transistor in a small-signal model.

In order to achieve the objective of the present invention, an embodiment of the present invention further provides a circuit system, and the circuit system includes a delay circuit according to one of above-mentioned embodiments, and a load electrically connected to the delay circuit. The load receives the output signal.

According to above-mentioned contents, the embodiment of the present invention provides the delay circuit having the delay time which is not related to a change in the voltage level of the input signal, and the delay circuit of the present invention has simple architecture and does not need a large area and comparator or bias circuit which consume higher power.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
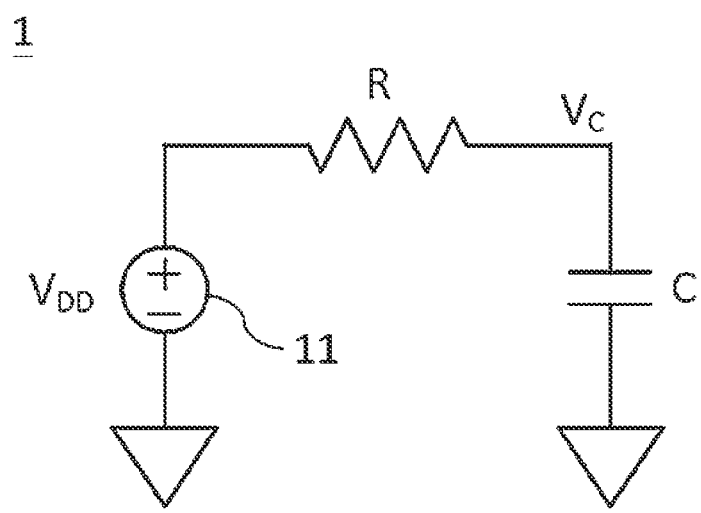
FIG. 1 is a circuit diagram of a conventional delay circuit.
Figure 2:
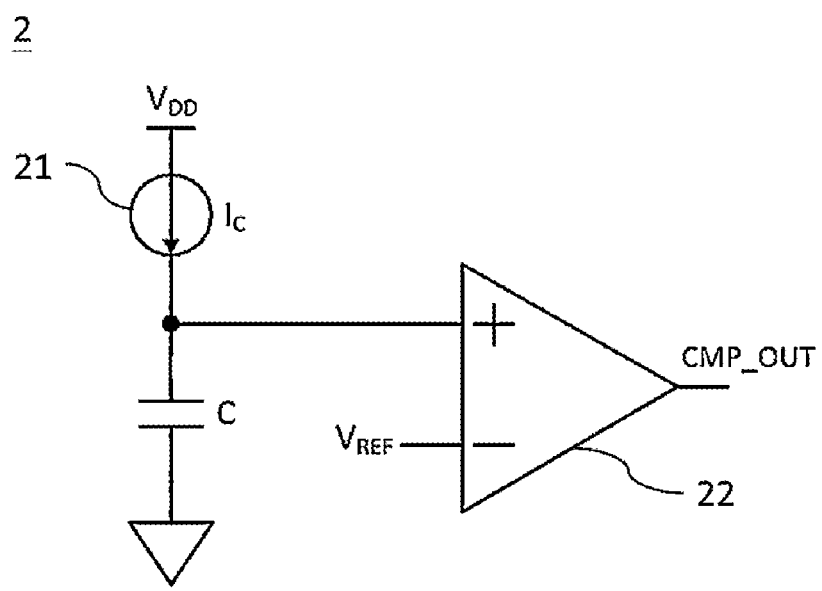
FIG. 2 is a circuit diagram of another conventional delay circuit.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," ""connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

The embodiment of the present invention provides a delay circuit having a smaller chip area and lower power consumption, and a delay time of the delay circuit is not related to a change in a voltage level of an input signal. The delay circuit does not need to use a comparator and any bias circuit, and the architecture of the delay circuit is simpler and can be implemented easily, so that the delay circuit of the present invention has relative lower manufacturing cost. The delay circuit mainly uses a voltage/current conversion unit which generates a current being proportional to the voltage level of the input signal, and use the generated current to charge a capacitor, and use an output logic unit to obtain a voltage on a terminal of the capacitor to generate an output signal, so as to compensate the effect occurred on the delay time due to the change in the voltage level of the input signal, thereby implementing the delay circuit having the constant delay time. Preferably, the output logic unit can include at least one inverter; and in a preferred embodiment of the present invention, the output logic unit can include an even number of inverters connected in series, for example, the output logic unit can include two inverters connected in series.

Figure 3:
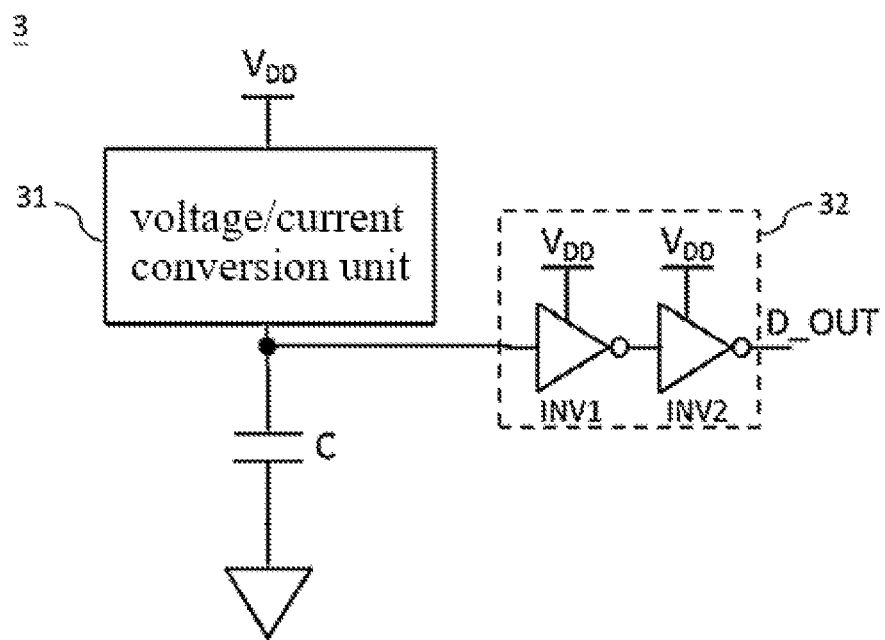
FIG. 3 is a circuit diagram of a delay circuit of an embodiment, according to the present invention.

Please refer to FIG. 3, which is a circuit diagram of a delay circuit of an embodiment, according to the present invention. The delay circuit 3 includes a voltage/current conversion unit 31, a capacitor C and an output logic unit 32, the voltage/current conversion unit 31 receives an input signal with a voltage level being a supply voltage VDD, and the voltage/current conversion unit 31 is electrically connected to a first terminal of the capacitor C, and a second terminal of the capacitor C is electrically connected to a low voltage (such as a ground voltage). An input terminal of the output logic unit 32 is electrically connected to the first terminal of the capacitor C, an output terminal of the output logic unit 32 can generate an output signal D_OUT. The current generated by the voltage/current conversion unit 31 is proportional to the voltage level of the input signal, the current generated by the voltage/current conversion unit 31 can be used to charge the capacitor C. The output logic unit 32 receives the input signal with the voltage level being the supply voltage VDD, and uses the input signal as the operating voltage for use. In an embodiment, the output logic unit 32 can be implemented by two inverters INV1 and INV2 connected in series. It should be noted that the operating voltage received by the output logic unit 32 can be not equal to the supply voltage VDD but be related to the input signal; for example, the operating voltage received by the output logic unit 32 is an operating voltage generated by the buck converting the supply voltage VDD.

In general, a transition voltage point of each of the inverters INV1 and INV2 (or the output logic unit 32) is a half of the supply voltage $V_{DD}$, that is $V_{DD}/2$, so the time T required for charging the voltage on the first terminal of the capacitor C to reach a half of the supply voltage is $T=(C/I) \times (V_{DD}/2)$. The delay time of the delay circuit 3 is a time difference between a transition time point of the input signal and a transition time point of the output signal, that is, the delay time of the delay circuit 3 is the time T plus the delay time of the output logic unit 32. The time required for charging the voltage on the first terminal of the capacitor C to reach a half of the supply voltage $V_{DD}$ is a portion of the delay time of the delay circuit 3, the delay time of the output logic unit 32 is substantially constant, but the time T is varied in response to the voltage level of the input signal and the current. In a condition that the capacitance value of the capacitor C is a constant value, as long as the current I generated by the voltage/current conversion unit 31 is proportional to the supply voltage VDD, the time T can become a constant value eventually. It should be noted that the output logic unit 32 can be implemented by an inverter, or implemented by two or more inverters, but the present invention is not limit thereto. In above-mentioned content, the transition voltage point of each of the inverter INV1 and INV2 (or the output logic unit 32) being a half of the supply voltage $V_{DD}$ is taken as example for illustration, but the concept of the present invention is not limit thereto, as long as the current generated by the voltage/current conversion unit 31 is proportional to the supply voltage $V_{DD}$, the time T of the delay time is not related to the voltage level of the input signal, that is, the delay time is not related to the voltage level of the input signal.

Figure 4:
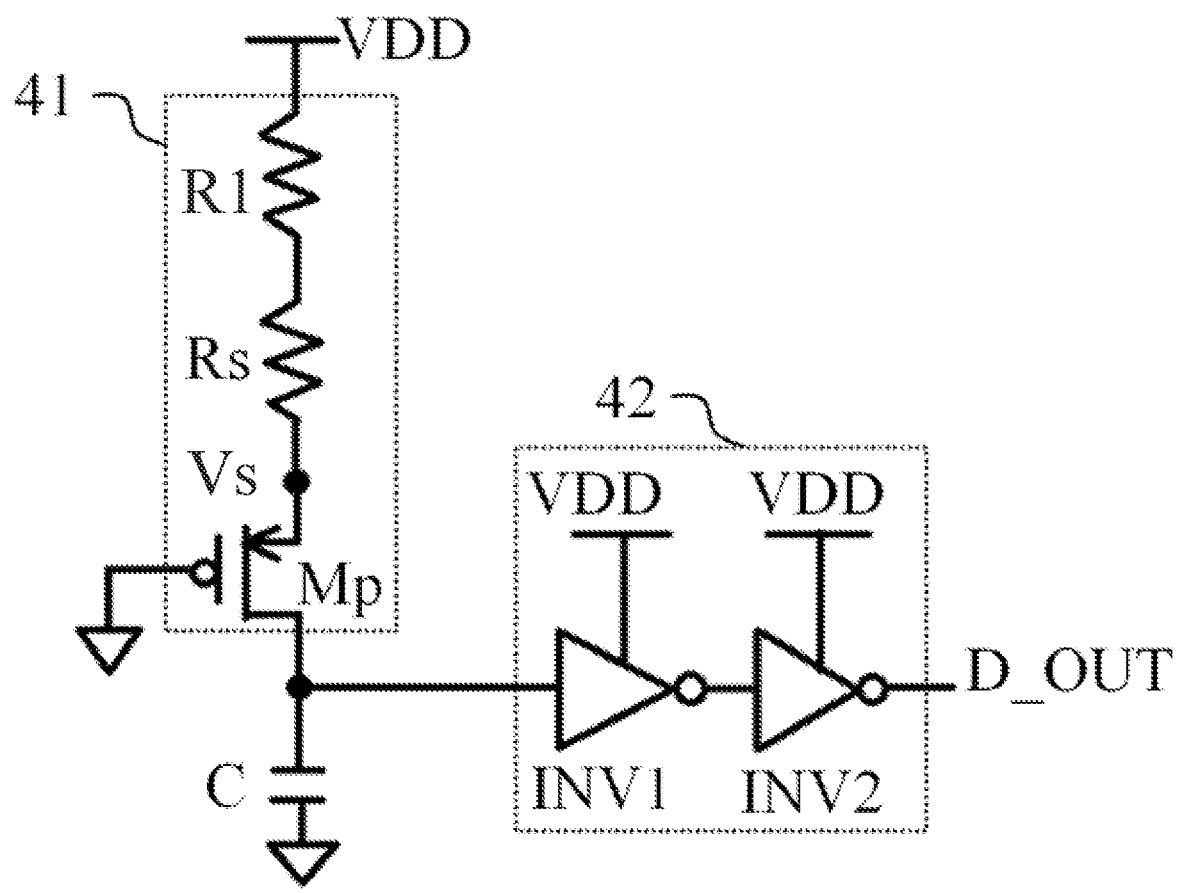
FIG. 4 is a circuit diagram of a delay circuit of another embodiment, according to the present invention.

Please refer to FIG. 4, which is a circuit diagram of a delay circuit of another embodiment, according to the present invention. The delay circuit 4 includes a voltage/current conversion unit 41, a capacitor C and an output logic unit 42. The capacitor C and the output logic unit 42 of FIG. 4 are the same as the capacitor C and the output logic unit 32 of FIG. 3, respectively, so the detailed descriptions are not repeated herein. The voltage/current conversion unit 41 of FIG. 4 is one of implementations of the voltage/current conversion unit 31 of FIG. 3, but the concept of the present invention is not limit thereto.

In the embodiment, the voltage/current conversion unit 41 includes a transistor MP, and the transistor $M_P$ includes a source degeneration resistor $R_S$, a first terminal of the source degeneration resistor $R_S$ receives the input signal, a second terminal of the source degeneration resistor $R_S$ is electrically connected to the source of the transistor $M_P$. A gate of the transistor $M_P$ is electrically connected to a ground voltage, and a drain of the transistor $M_P$ is electrically connected to the first terminal of the capacitor C. In the embodiment, the transistor MP can be a PMOS transistor.

In the embodiment, when the resistance value of the source degeneration resistor $R_S$ is far greater than a reciprocal of a transduction gm of the transistor MP in a small-signal model (that is, $R_S \gg 1/gm$), the drain current $I_D$ (that is, the current generated by the voltage/current conversion unit 41) flowing through the drain of the transistor $M_P$ is $I_D = V_{SG}/R_S$, where $V_{SG}$ is a voltage difference between the source and the gate of the transistor $M_P$ (in this embodiment, the $V_{SG}$ is voltage $V_S$), and the voltage $V_S = V_{DD} - I_D R_S$, so that the current $I_D$ can be calculated as $V_{DD}/2R_S$, the current $I_D$ is proportional to the supply voltage $V_{DD}$. Furthermore, according to above-mentioned contents, the transition voltage point (such as the input threshold voltage of each of the inverter INV1 and INV2) of each of the inverter INV1 and INV2 (or the output logic unit 32) is a half of the supply voltage $V_{DD}$, (that is, $V_{DD}/2$), and the time T ($T=(C/I_D) \times (V_{DD}/2) = CR_S$) in the delay time of the delay circuit 4 is fully not related to the supply voltage $V_{DD}$. Incidentally, in other embodiments, when the source degeneration resistor $R_S$ is not large enough, a large resistor R1 can be connected directly between the source of the transistor $M_P$ and the input signal, and the resistance value of the resistor R1 is much larger than the reciprocal of the transduction $g_m$.

Furthermore, an embodiment of the present invention also provides a circuit system, and the circuit system can have a load which may be easily damaged in a not-ready state when receiving high voltage, but the concept of the present invention is not limit thereto. The circuit system includes a delay circuit of any one of aforementioned embodiments and modifications, and a load. The load is electrically connected to the output terminal of the delay circuit, to receive the output signal outputted by the delay circuit. In practical application, the load can be various types of functional circuits, such as precision microelectromechanical (MEMS) chips, sensing instruments, or automotive electronic chips; however, the present invention is not limited to the type of the load.

According the above-mentioned contents, the embodiment of the present invention provides a delay circuit having a smaller chip area and lower power consumption, and the delay time of the delay circuit is not related to a change in a voltage level of the input signal. The delay circuit of the present invention does not need to use a comparator and a bias circuit, such as voltage/current bias circuit or a bias circuit for static current, and the architecture of the delay circuit of the present invention is simpler and can be implemented easily, and has relative lower manufacturing cost.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A delay circuit, comprising:
    a voltage/current conversion unit configured to receive an input signal and generate current based on a voltage level of the input signal, wherein the generated current is proportional to the voltage level of the input signal;
    a capacitor electrically connected to the voltage/current conversion unit and configured to receive the current, generated by the voltage/current conversion unit, to charge; and
    an output logic unit electrically connected to the capacitor and configured to receive a voltage signal on a terminal of the capacitor, to generate an output signal based on the voltage signal, wherein a delay time between a transition time point of the input signal and a transition time point of the output signal is not related to the voltage level of the input signal;
    wherein when a voltage level of the voltage signal is equal to a half of the voltage level of the input signal, transition of the output signal occurs.

2. The delay circuit according to claim 1, wherein the output logic unit comprises at least one inverter.

3. The delay circuit according to claim 1, wherein the output logic unit includes an even number of inverters connected in series.

4. The delay circuit according to claim 1, wherein the input signal is a supply voltage, the output logic unit receives an operating voltage, and the operating voltage is related to the supply voltage.

5. The delay circuit according to claim 1, wherein the voltage/current conversion unit comprises:
    a source degeneration resistor; and
    a transistor comprises a gate electrically connected to a ground voltage, and a drain electrically connected to the capacitor, wherein the source degeneration resistor is electrically connected between the source of the transistor and the input signal.

6. The delay circuit according to claim 5, wherein the transistor is a PMOS transistor.

7. The delay circuit according to claim 5, wherein resistance value of the source degeneration resistor is far greater than a reciprocal of a transduction of the transistor in a small-signal model.

8. The delay circuit according to claim 5, wherein the voltage/current conversion unit comprises:
a resistor disposed between the source degeneration resistor and the input signal, and a resistance value of the resistor is far greater than a reciprocal of a transduction of the transistor in a small-signal model.

9. A circuit system, comprising:
a delay circuit, comprising:
a voltage/current conversion unit configured to receive an input signal and generate current based on a voltage level of the input signal, wherein the generated current is proportional to the voltage level of the input signal;
a capacitor electrically connected to the voltage/current conversion unit and configured to receive the current, generated by the voltage/current conversion unit, to charge; and
an output logic unit electrically connected to the capacitor and configured to receive a voltage signal on a terminal of the capacitor, to generate an output signal based on the voltage signal, wherein a delay time between a transition time point of the input signal and a transition time point of the output signal is not related to the voltage level of the input signal; and
a load electrically connected to the delay circuit to receive the output signal;
wherein when a voltage level of the voltage signal is equal to a half of the voltage level of the input signal, transition of the output signal occurs.

10. The circuit system according to claim 9, wherein the output logic unit comprises at least one inverter.

11. The circuit system according to claim 9, wherein the output logic unit includes an even number of inverters connected in series.

12. The circuit system according to claim 9, wherein the input signal is a supply voltage, the output logic unit receives an operating voltage, and the operating voltage is related to the supply voltage.

13. The circuit system according to claim 9, wherein the voltage/current conversion unit comprises:
a source degeneration resistor; and
a transistor comprises a gate electrically connected to a ground voltage, and a drain electrically connected to the capacitor, wherein the source degeneration resistor is electrically connected between the source of the transistor and the input signal.

14. The circuit system according to claim 13, wherein the transistor is a PMOS transistor.

15. The circuit system according to claim 13, wherein a resistance value of the source degeneration resistor is far greater than a reciprocal of a transduction of the transistor in a small-signal model.

16. The circuit system according to claim 13, wherein the voltage/current conversion unit comprises:
a resistor disposed between the source degeneration resistor and the input signal, and a resistance value of the resistor is far greater than a reciprocal of a transduction of the transistor in a small-signal model.

* * * * *